United States Patent
Oishi

(10) Patent No.: US 8,450,780 B2
(45) Date of Patent: May 28, 2013

(54) SOLID-STATE IMAGING SENSOR, METHOD OF MANUFACTURING THE SAME, AND IMAGE PICKUP APPARATUS

(75) Inventor: Tetsuya Oishi, Kanagawa (JP)

(73) Assignee: Sony Corporation (JP)

( * ) Notice: Subject to any disclaimer, the term of this patent is extended or adjusted under 35 U.S.C. 154(b) by 190 days.

(21) Appl. No.: 12/657,047

(22) Filed: Jan. 13, 2010

(65) Prior Publication Data
US 2010/0181602 A1    Jul. 22, 2010

(30) Foreign Application Priority Data
Jan. 16, 2009  (JP) ................. P2009-007346

(51) Int. Cl.
*H01L 21/28* (2006.01)
*H01L 27/148* (2006.01)

(52) U.S. Cl.
USPC ........... 257/225; 257/E27.132; 257/E31.079; 257/292; 257/290; 257/440; 438/59; 438/75; 438/478; 438/199; 438/200

(58) Field of Classification Search ............... 257/225, 257/E27.132, E31.079, 292, 290, 440; 438/59, 438/478, 75, 199, 200
See application file for complete search history.

(56) References Cited

U.S. PATENT DOCUMENTS

| 2002/0054226 A1 | 5/2002 | Lee | |
| 2007/0145438 A1* | 6/2007 | Adkisson et al. | 257/290 |
| 2008/0029792 A1* | 2/2008 | Shim | 257/290 |

FOREIGN PATENT DOCUMENTS

JP    2002-110957 A    4/2002

* cited by examiner

Primary Examiner — Cathy N Lam
(74) Attorney, Agent, or Firm — Lerner, David, Littenberg, Krumholz & Mentlik, LLP

(57) ABSTRACT

Disclosed is a solid-state image sensor including a photoelectric converter, a charge detector, and a transfer transistor. The photoelectric converter stores a signal charge that is subjected to photoelectric conversion. The charge detector detects the signal charge. The transfer transistor transfers the signal charge from the photoelectric converter to the charge detector. In the solid-state image sensor, the transfer transistor includes a gate insulating film, a gate electrode formed on the gate insulating film, a first spacer formed on a sidewall of the gate electrode on a side of the photoelectric converter, and a second spacer formed on another sidewall of the gate electrode on a side of the charge detector. The first spacer is longer than the second spacer.

3 Claims, 9 Drawing Sheets

SOLID-STATE IMAGING SENSOR, METHOD OF MANUFACTURING THE SAME, AND IMAGE PICKUP APPARATUS

CROSS-REFERENCE TO RELATED APPLICATION

The present application claims priority from Japanese Patent Application No. JP 2009-007346 filed in the Japanese Patent Office on Jan. 16, 2009, the entire content of which is incorporated herein by reference.

BACKGROUND OF THE INVENTION

1. Field of the Invention

The present invention relates to a solid-state image sensor, a method of manufacturing the same, and an image pickup apparatus.

2. Description of the Related Art

As a solid-state image sensor, a CMOS (complementary metal oxide semiconductor) solid-state image sensor is widely known. An example of a structure of the CMOS solid-state image sensor is shown in FIG. 9. In FIG. 9, a photodiode 102 and a floating diffusion 103 is formed in a semiconductor substrate 101. The photodiode 102 has a P-N junction structure including an N-type impurity region 104 and a P-type impurity region 105. The floating diffusion 103 is formed of an N-type impurity region 106.

Further, on the semiconductor substrate 101, a transfer transistor 107 is formed. The transfer transistor 107 is structured so that the photodiode 102 and the floating diffusion 103 are set as a source/drain region, respectively. The transfer transistor 107 includes a gate insulating film 108, a gate electrode 109, and spacers 110 and 111. The gate insulating film 108 is formed between the photodiode 102 and the floating diffusion 103. The gate electrode 109 is formed on the gate insulating film 108. The spacer 110 is formed on a sidewall of the gate electrode 109 on a side of the photodiode 102, and the spacer 111 is formed on the other sidewall of the gate electrode 109 on a side of the floating diffusion 103.

The spacers 110 and 111 that cover the sidewalls of the gate electrode 109 are symmetrically formed. Therefore, a length L3 of the spacer 110 and a length L4 of the spacer 111 are set to be the same length (size). In addition, the P-type impurity region 105 is formed in the self-aligned manner with respect to the spacer 110, and the N-type impurity region 106 is formed in the self-aligned manner with respect to the spacer 111.

The length L3 of the spacer 110 and the length L4 of the spacer 111 affect characteristics of a solid-state image sensor. For example, if the length L4 of the spacer 111 on the floating diffusion 103 side is short, a dark current is increased due to a so-called GIDL (gate induced drain leakage). To prevent this, it is desirable to set the length L4 of the spacer 111 to be long to some extent.

On the other hand, if the length L3 of the spacer 110 on the photodiode 102 side is long, pinning of the N-type impurity region 104 of the photodiode 102 is weaken, resulting in the increase in the dark current. Further, if the length L3 of the spacer 110 is short, the dark current is suppressed, but an afterimage is deteriorated. Accordingly, an optimal size of the length L3 of the spacer 110 needs to be set to strike a balance between the characteristics of the dark current and the afterimage.

Japanese Patent Application Laid-open No. 2002-110957 discloses a CMOS image sensor in which a spacer formed on a side of a photodiode is longer than a spacer formed on a side of a floating diffusion.

SUMMARY OF THE INVENTION

In the solid-state image sensor shown in FIG. 9, the lengths L3 and L4 of the spacers 110 and 111 are the same due to the structural symmetry as described above. Therefore, for example, in the case where the length L4 of the spacer 111 is increased in order to suppress the dark current on the floating diffusion 103 side, the length L3 of the spacer 110, which is formed to have the same size as the spacer 111, may be deviated from an optimal value. Conversely, in the case where the length L3 of the spacer 110 is optimized in order to strike the balance between the characteristics of the dark current and the afterimage on the photodiode 102 side, the length L4 of the spacer 111, which is formed to have the same size as the spacer 110, becomes too short, resulting in the increase in the dark current. For this reason, in related art, an appropriate control on both the suppression of the dark current on the floating diffusion 103 side and the optimization of the dark current and the afterimage on the photodiode 102 side is difficult to be performed.

In view of the above-mentioned circumstances, it is desirable to provide a solid-state image sensor, a method of manufacturing the same, and an image pickup apparatus that are capable of simultaneously realizing a suppression of a dark current on a charge detector side and an optimization of characteristics of a dark current and an afterimage on a photoelectric converter side.

According to an embodiment of the present invention, there is provided a solid-state image sensor, comprising a photoelectric converter, a charge detector, and a transfer transistor. The photoelectric converter stores a signal charge that is subjected to photoelectric conversion. The charge detector detects the signal charge. The transfer transistor transfers the signal charge from the photoelectric converter to the charge detector. The transfer transistor includes a gate insulating film, a gate electrode formed on the gate insulating film, a first spacer formed on a sidewall of the gate electrode on a side of the photoelectric converter, and a second spacer formed on another sidewall of the gate electrode on a side of the charge detector. The first spacer is shorter than the second spacer.

In the solid-state image sensor according to the embodiment of the present invention, on the photoelectric converter side, the length of the first spacer can be set in accordance with an optimal value for striking characteristics of a dark current and an after image regardless of the length of the second spacer. In addition, on the charge detector side, the length of the second spacer can be set in accordance with a size suitable for suppressing the dark current regardless of the length of the first spacer.

According to another embodiment of the present invention, there is provided a first method of manufacturing a solid-state image sensor. The method includes forming a gate electrode on a semiconductor substrate through a first insulating film, etching the gate electrode so that a part of the gate electrode on a side of a photoelectric converter formation region is lower than a part of the gate electrode on a side of a charge detector formation region, forming a second insulating film on the semiconductor substrate in a state of covering the first insulating film and the gate electrode, and etching the first insulating film and the second insulating film so that a first spacer formed on a sidewall of the gate electrode on the side of the photoelectric converter formation region is shorter than a second spacer formed on a sidewall of the gate electrode on the side of the charge detector formation region.

In the first method of manufacturing the solid-state image sensor according to the embodiment of the present invention, obtained is the solid-state image sensor in which the first spacer formed on the sidewall of the gate electrode on the photoelectric converter formation region side is set to be shorter than the second spacer formed on the sidewall of the gate electrode on the charge detector formation region side. Further, the length of the first spacer can be controlled with the amount of etching by which the gate electrode is etched being set as a process parameter, and the length of the second spacer can be controlled with a thickness of the second insulating film being set as a process parameter.

According to another embodiment of the present invention, there is provided a second method of manufacturing a solid-state image sensor. The second method includes forming a gate electrode on a semiconductor substrate through a first insulating film, forming a second insulating film on the semiconductor substrate in a state of covering the first insulating film and the gate electrode, etching the first insulating film and the second insulating film so that a first spacer formed on a sidewall of the gate electrode on a side of a photoelectric converter formation region has the same length as a second spacer formed on a sidewall of the gate electrode on a side of a charge detector formation region, and etching the first spacer so that the first spacer is shorter than the second spacer.

In the second method of manufacturing the solid-state image sensor according to the embodiment of the present invention, obtained is the solid-state image sensor in which the first spacer formed on the sidewall of the gate electrode on the photoelectric converter formation region side is set to be shorter than the second spacer formed on the sidewall of the gate electrode on the charge detector formation region side. Further, the length of the first spacer can be controlled with the amount of etching by which the first spacer is etched being set as a process parameter, and the length of the second spacer can be controlled with a thickness of the second insulating film being set as a process parameter.

According to the embodiments of the present invention, in the solid-state image sensor including the photoelectric converter, the charge detector, and the transfer transistor, suppression of the dark current on the charge detector side and striking of the balance between the characteristics of the dark current and the after image can be realized at the same time.

These and other objects, features and advantages of the present invention will become more apparent in light of the following detailed description of best mode embodiments thereof, as illustrated in the accompanying drawings.

DESCRIPTION OF PREFERRED EMBODIMENTS

Figure 1:
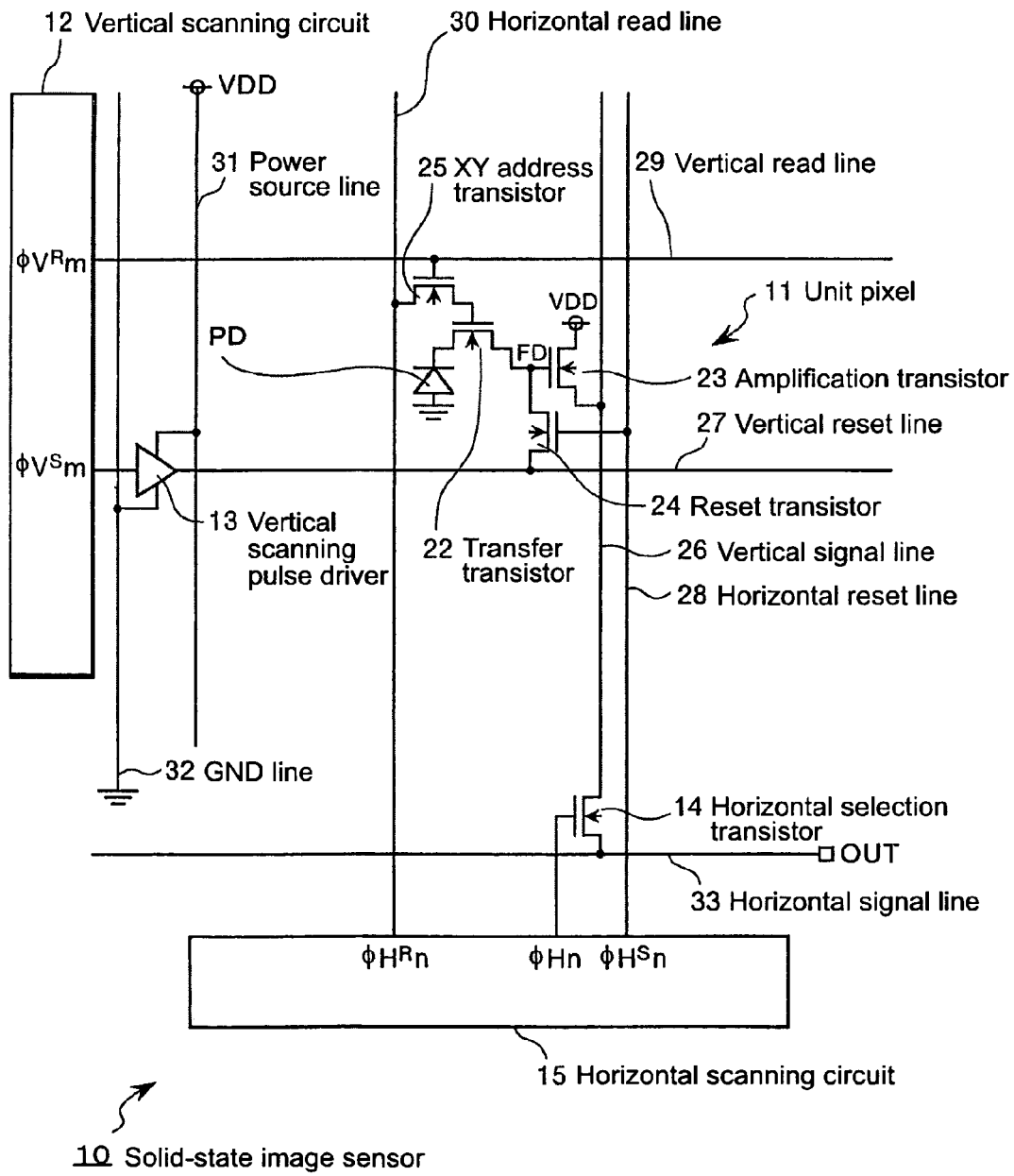
FIG. 1 is a schematic view showing a structural example of a CMOS solid-state image sensor as an example of a solid-state image sensor to which the present invention is applied.

Hereinafter, embodiments of the present invention will be described in detail with reference to the drawings. It should be noted that the technical scope of the present invention is not limited to the following embodiments and includes various modifications and alternations insofar as they are within the scope in which specific effects can be obtained from constituents of the present invention and combinations thereof.

The embodiments of the present invention will be described in an order of the following items.

1. Overall structure of solid-state image sensor
2. Structure of solid-state image sensor according to first embodiment
3. Method of manufacturing solid-state image sensor according to first embodiment
4. Structure of solid-state image sensor according to second embodiment
5. Method of manufacturing solid-state image sensor according to second embodiment
6. Application example <1. Overall Structure of Solid-State Image Sensor>

FIG. 1 is a schematic diagram showing a structural example of a CMOS solid-state image sensor as an example of a solid-state image sensor to which the present invention is applied. A solid-state image sensor 10 shown in FIG. 1 includes a unit pixel 11, a vertical scanning circuit 12, a vertical scanning pulse driver 13, a horizontal selection transistor 14, and a horizontal scanning circuit 15. The unit pixels 11 are two-dimensionally disposed in a matrix pattern to form an imaging area. The vertical scanning circuit 12 is provided outside the imaging area.

The unit cell 11 is constituted of a photodiode PD and four transistors of a transfer transistor 22, an amplification transistor 23, a reset transistor 24, and an XY address transistor 25. For each of the pixel transistors 22 to 25, a MOS transistor is used. It should be noted that in this case, only the unit pixel in an m-th row and an n-th column is shown for simplification of the figure.

In the unit pixel 11, the transfer transistor 22 has a source connected to a cathode of the photodiode PD and a drain connected to a gate of the amplification transistor 23. A connection portion of the drain of the transfer transistor 22 and the gate of the amplification transistor 23 corresponds to a floating diffusion FD. The drain of the amplification transistor 23 is connected to a power source VDD, and the source thereof is connected to a vertical signal line 26.

The reset transistor 24 has a drain connected to a vertical reset line 27, a source connected to the connection potion (FD) between the drain of the transfer transistor 22 and the gate of the amplification transistor 23, and a gate connected to a horizontal reset line 28. The XY address transistor 25 has a gate connected to a vertical read line 29, a drain connected to a horizontal read line 30, and a source connected to the gate of the transfer transistor 22.

Outside the image pickup area, the vertical scanning circuit 12 sequentially outputs vertical read scanning pulses φVRm (φVR1, φVR2, . . . , φVRm, . . . , φVRM) and vertical reset scanning pulses φVSm (φVS1, φVS2, . . . , φVSm, . . . , φVSM). The vertical read scanning pulses φVRm are applied to the vertical read line 29 in the corresponding row. The vertical reset scanning pulses φVSm are applied to the vertical reset line 27 in the corresponding row through the vertical scanning pulse driver 13.

The vertical scanning pulse driver 13 has a circuit terminal on the power source side that is connected to a power source line 31 of the power source voltage VDD and a circuit terminal on a GND side that is connected to a GND line 32. The vertical scanning pulse driver 13 drives the vertical reset line 27 based on the vertical reset scanning pulses φVSm supplied from the vertical scanning circuit 12. At this time, the vertical scanning pulse driver 13 shifts a GND level of the GND line 32 to about 0.5 to 0.8 V, with the vertical reset scanning pulses φVSm being at an "L" level, to be given to the vertical reset line 27.

The horizontal scanning circuit 15 sequentially outputs horizontal read scanning pulses φHRn (φHR1, φHR2, . . . , φHRn, . . . , φHRN), horizontal selection scanning pulses φHn (φH1, φH2, . . . , φHn, . . . , φHN), and horizontal reset scanning pulse φHSn (φHS1, φHS2, . . . , φHSn, . . . , φHSN). The horizontal read scanning pulses φHRn are applied to the horizontal read line 30 of a corresponding column. The horizontal reset scanning pulses φHSn are applied to the horizontal reset line 28 of a corresponding column. The horizontal selection scanning pulses φHn are applied to the gate of the horizontal selection transistor 14 of a corresponding column. The horizontal selection transistor 14 is connected between an end of the vertical signal line 26 and a horizontal signal line 33 for each column.

<2. Structure of Solid-State Image Sensor According to First Embodiment>

Figure 2:
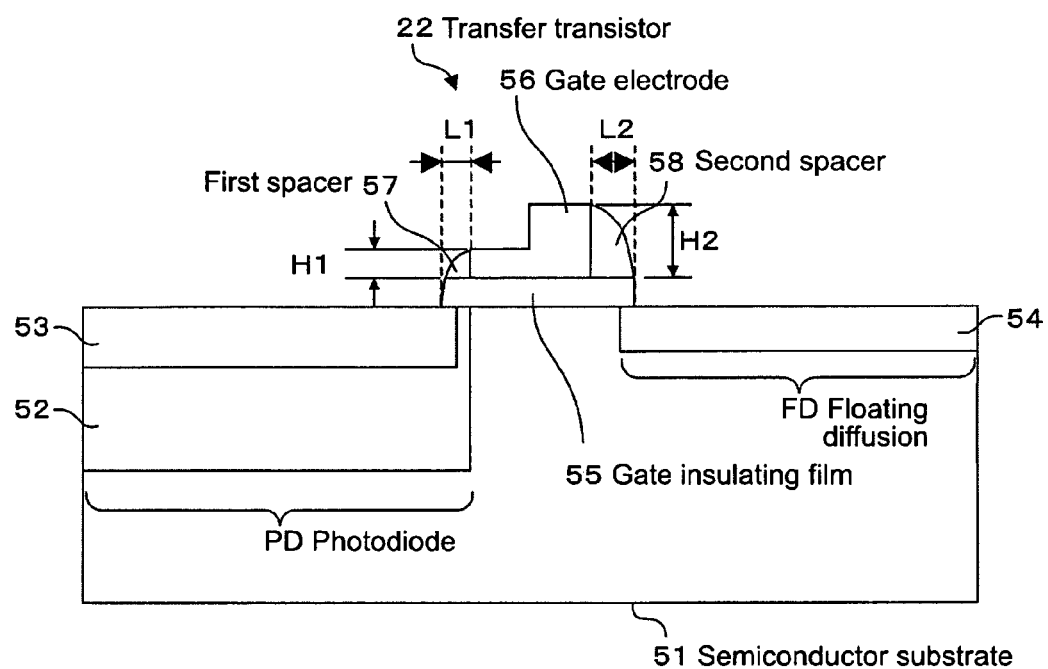
FIG. 2 is an enlarged cross-sectional view showing a part of a solid-state image sensor according to a first embodiment of the present invention.

FIG. 2 is an enlarged cross-sectional view of the solid-state image sensor according to the first embodiment of the present invention. In FIG. 2, on a semiconductor substrate 51, the photodiode PD, the floating diffusion FD, and the transfer transistor 22 described above are formed. The photodiode PD serves as the photoelectric converter for storing a signal charge that has been subjected to a photoelectric conversion. More specifically, the photodiode PD converts incident light to an electric signal depending on a light amount thereof and generates a signal charge, and stores the generated signal charge therein. The photodiode PD has a P-N junction structure including an N-type impurity region 52 and a P-type impurity region 53. The floating diffusion FD serves as the charge detector that detects the signal charge transferred by the transfer transistor 22 from the photodiode PD. The floating diffusion FD is formed of an N-type impurity region 54.

The transfer transistor 22 transfers the signal charge stored through the photoelectric conversion by the photodiode PD to the floating diffusion FD. The transfer transistor 22 includes the photodiode PD and the floating diffusion FD as source and drain regions, respectively. The transfer transistor 22 is provided with a gate insulating film 55, a gate electrode 56, a first spacer 57, and a second spacer 58. The gate insulating film 55 is formed between the photodiode PD and the floating diffusion FD. The gate electrode 56 is formed on the gate insulating film 55. The first spacer 57 is disposed on a sidewall of the gate electrode 56 on a side of the photodiode PD. The second spacer 58 is disposed on the other sidewall of the gate electrode 56 on a side of the floating diffusion FD. In addition, the P-type impurity region 53 is formed in a self-aligned manner with respect to the first spacer 57, and the N-type impurity region 54 is formed in the self-aligned manner with respect to the second spacer 58.

On the semiconductor substrate 51, the first spacer 57 and the second spacer 58 are asymmetrically formed. More specifically, when a length L1 of the first spacer 57 and a length L2 of the second spacer 58 are compared with each other, the length L1 of the first spacer 57 is set to be shorter than the length L2 of the second spacer 58. The length of the spacer refers to a spacer size in a length direction (hereinafter, also referred to as "gate length direction") of the gate electrode 56. The length direction of the gate electrode 56 corresponds to a horizontal direction in FIG. 2, and a width direction of the gate electrode 56 corresponds to a depth direction in FIG. 2. The length of the spacer is defined by a size from the sidewall of the gate electrode 56 to an end portion of the spacer in the length direction of the gate electrode 56. Therefore, the length L1 of the first spacer 57 is defined by the size from the one sidewall of the gate electrode 56 to the end portion of the first spacer 57, and the length L2 of the second spacer 58 is defined from the other sidewall of the gate electrode 56 to the end portion of the second spacer 58.

The length L1 of the first spacer 57 is set to an optimal size for striking a balance between characteristics of a dark current and an afterimage on the photodiode PD side. The length L2 of the second spacer 58 is set to a size suitable for suppressing a dark current on the floating diffusion FD side. The size optimal for striking the balance between the characteristics of the dark current and the afterimage on the photodiode PD side is smaller than the size suitable for suppressing the dark current on the floating diffusion FD side. Therefore, the length L1 of the first spacer 57 is set to be shorter than the length L2 of the second spacer 58 as described above.

Further, on an upper surface of the gate electrode 56, a step is formed. By providing the step, a height of the gate electrode 56 on the photodiode PD side is lower than a height of the gate electrode 56 on the floating diffusion FD side. The height of the gate electrode 56 refers to a size of the gate electrode in a thickness direction of the semiconductor substrate 51. When the height of the gate electrode 56 is defined from a boundary surface between the gate insulating film 55 and the gate electrode 56, a height H1 of the gate electrode 56 on the photodiode PD side is lower than a height H2 of the gate electrode 56 on the floating diffusion FD side.

<3. Method of Manufacturing Solid-State Image Sensor According to First Embodiment>

Figure 3A:
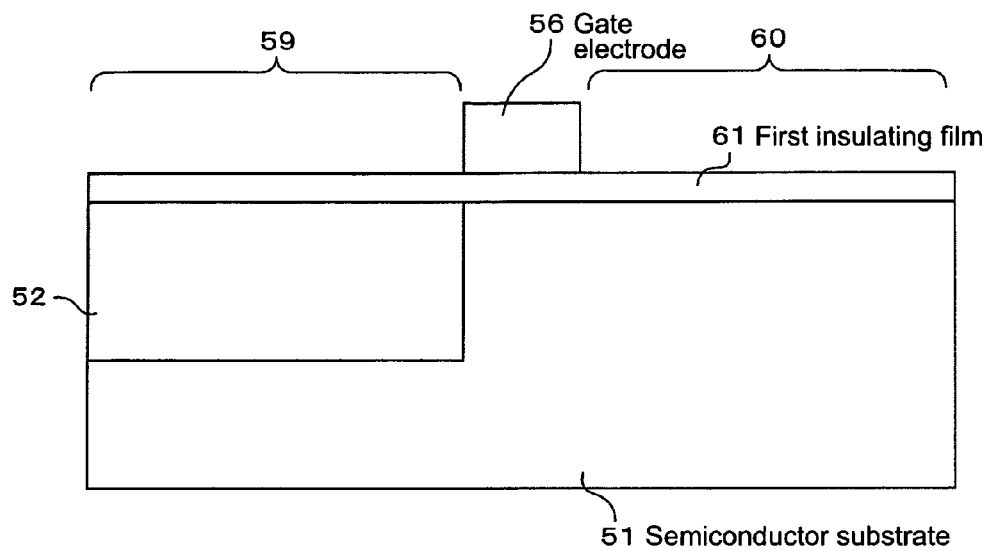
FIG. 3 is a diagram (part 1) for explaining a method of manufacturing the solid-state image sensor according to the first embodiment of the present invention.

FIGS. 3A, 3B, 4A, and 4B are diagrams for explaining a method of manufacturing the solid-state image sensor according to the first embodiment of the present invention. First, as shown in FIG. 3A, on the semiconductor substrate 51, a first insulating film 61 and the gate electrode 56 are formed in this order, along with an element isolation region (not shown). The first insulating film 61 corresponds to the gate insulating film 55 as described above, and is formed so as to broadly cover an upper surface of the semiconductor substrate 51 in this stage. The gate electrode 56 is formed into a predetermined shape by a patterning process. Subsequently, an ion implantation of N-type impurities is performed to the semiconductor substrate 51, thereby forming the N-type impurity region 52. Here, to the semiconductor substrate 51, a photodiode formation region 59 in which the photodiode PD is formed and a floating diffusion formation region 60 in which the floating diffusion FD is formed are provided. The photodiode formation region 59 is provided on the side opposite to the floating diffusion formation region 60 with respect to the gate electrode 56. The N-type impurity region 52 is formed by performing the ion implantation of the N-type impurities to the photodiode formation region 59.

Figure 3B:
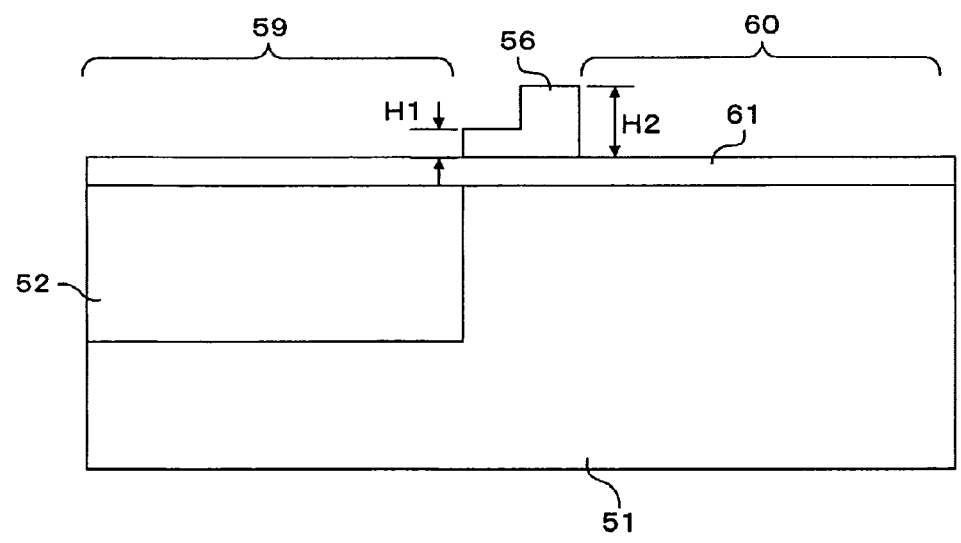

Next, as shown in FIG. 3B, the gate electrode 56 is selectively etched so that the height H1 of the gate electrode 56 on the photodiode formation region 59 side is lower than the height H2 of the gate electrode 56 on the floating diffusion formation region 60 side. In this case, the height H1 of the gate electrode 56 on the photodiode formation region 59 side is determined in consideration of the length L1 (see, FIG. 2) of the first spacer 57 formed in the following process.

Figure 4A:
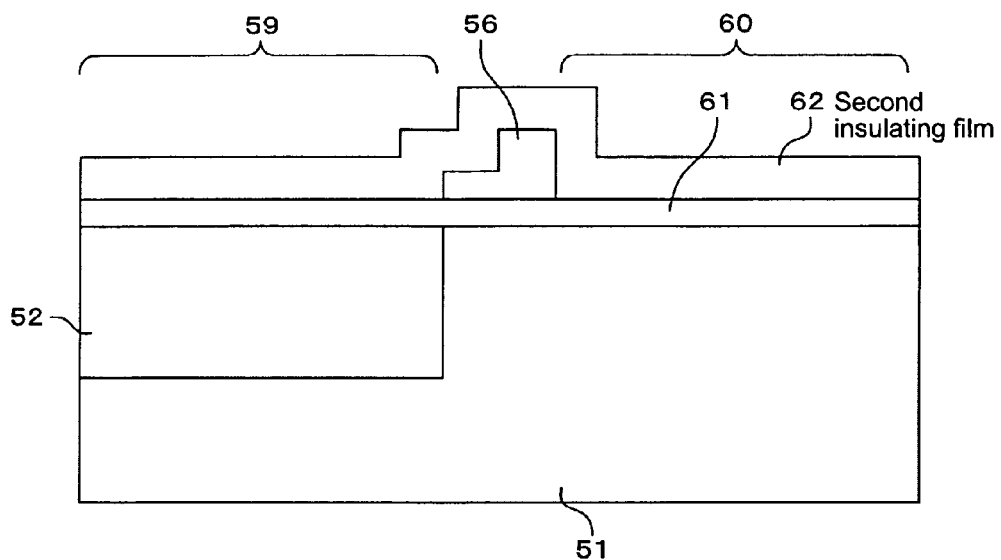
FIG. 4 is a diagram (part 2) for explaining the method of manufacturing the solid-state image sensor according to the first embodiment of the present invention.

Next, as shown in FIG. 4A, on the semiconductor substrate 51, a second insulating film 62 is formed in a state of covering the first insulating film 61 and the gate electrode 56. In this case, the second insulating film 62 is deposited so as to cover the entire surface of the semiconductor substrate 51. At this time, a thickness of the second insulating film 62 is determined in consideration of the length L2 (see, FIG. 2) of the second spacer 58 formed in the following process.

Figure 4B:
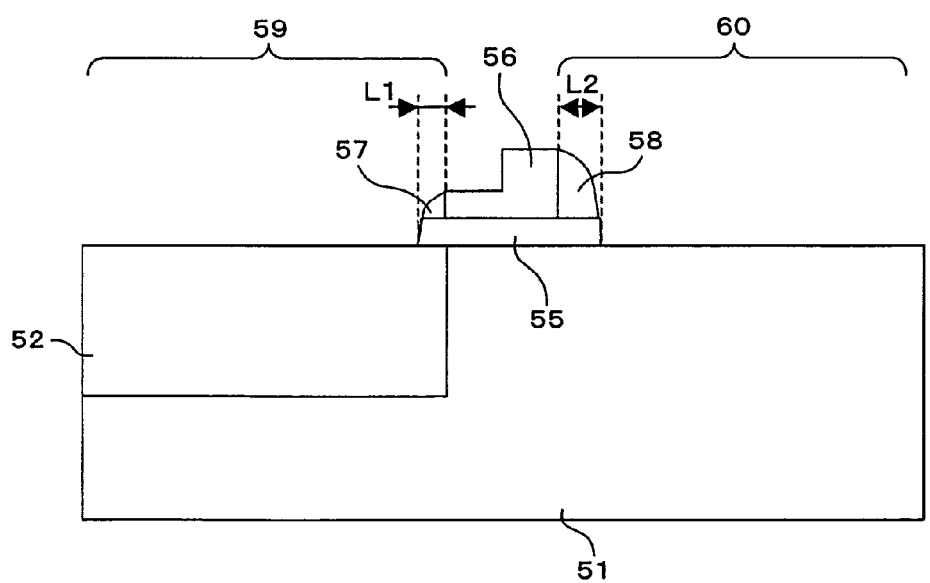

Next, as shown in FIG. 4B, the first insulating film 61 and the second insulating film 62 are etched (etching back process), thereby exposing the surface (upper surface) of the semiconductor substrate 51. As a result, the first spacer 57 is formed on the sidewall of the gate electrode 56 on the photodiode formation region 59 side, and the second spacer 58 is formed on the other sidewall of the gate electrode 56 on the floating diffusion formation region 60 side. In this case, the first spacer 57 is formed of an insulating material protruded from the sidewall of the gate electrode 56 toward the photodiode formation region 59 side. The second spacer 58 is formed of an insulating material protruded from the other sidewall of the gate electrode 56 toward the floating diffusion formation region 60 side. In addition, in the etching process of the first insulating film 61 and the second insulating film 62, the first and second insulating films 61 and 62 are etched at the same time other than a part lower than the gate electrode 56. In this way, on the lower side of the gate electrode 56, the gate insulating film 55 is formed of the insulating material of the first insulating film 61. In addition, on the one sidewall of the gate electrode 56, the first spacer 57 is formed of the insulating material of the first insulating film 61 and the second insulating film 62, and on the other sidewall of the gate electrode 56, the second spacer 58 is formed of the insulating material of the first insulating film 61 and the second insulating film 62.

The lengths L1 and L2 of the spacers 57 and 58 formed by etching the first insulating film 61 and the second insulating film 62 become longer as the heights H1 and H2 of the gate electrode 56 are increased. Further, the length L1 of the first spacer 57 depends on the height H1 of the gate electrode 56 on the photodiode formation region 59 side, and the length L2 of the second spacer 58 depends on the height H2 of the gate electrode 56 on the floating diffusion formation region 60 side. In this case, the heights H1 and H2 of the gate electrode 56 has a relationship of "H1<H2". Therefore, in accordance with this relationship, the length L1 of the first spacer 57 is formed to be shorter than the length L2 of the second spacer 58.

Next, by performing the ion implantation of the P-type impurities to the semiconductor substrate 51 with the photodiode formation region 59 being a target, the P-type impurity region 53 is formed. Further, by performing the ion implantation of the N-type impurities to the semiconductor substrate 51 with the floating diffusion formation region 60 being a target, the N-type impurity region 54 is formed. The P-type impurity region 53 is formed by performing the ion implantation of the P-type impurities to the semiconductor substrate 51 with the first spacer 57 being a mask. Therefore, the P-type impurity region 53 is formed in the self-aligned manner with respect to the first spacer 57. The N-type impurity region 54 is formed by performing the ion implantation of the N-type impurities to the semiconductor substrate 51 with the second spacer 58 being a mask. Therefore, the N-type impurity region 54 is formed in the self-aligned manner with respect to the second spacer 58. In this stage, the photodiode PD constituted of the N-type impurity region 52 and the P-type impurity region 53 and the floating diffusion FD formed of the N-type impurity region 54 are formed. As a result, the solid-state image sensor having the structure shown in FIG. 2 can be obtained.

In the first embodiment of the present invention, in the structure of the solid-state image sensor, the length L1 of the first spacer 57 is set to be shorter than the length L2 of the second spacer 58. Therefore, on the photodiode PD side, regardless of the length L2 of the second spacer 58, the length L1 of the first spacer 57 can be set in accordance with the optimal value for striking the balance between the characteristics of the dark current and the afterimage. In addition, on the floating diffusion FD side, regardless of the length L1 of the first spacer 57, the length L2 of the second spacer 58 can be set in accordance with the size suitable for suppressing the dark current. As a result, the suppression of the dark current on the floating diffusion FD side and the striking of the balance between the characteristics of the dark current and the afterimage on the photodiode PD side can be realized at the same time.

In addition, in the first embodiment of the present invention, in the structure of the solid-state image sensor, the height of the gate electrode 56 on the photodiode PD side is set to be lower than that of the gate electrode 56 on the floating diffusion FD side. Therefore, the second insulating film 62 having the uniform thickness is formed on the semiconductor substrate 51, and then the first insulating film 61 and the second insulating film 62 are just etched, with the result that the structure of the solid-state image sensor in which the length L1 of the first spacer 57 is shorter than the length L2 of the second spacer 58 can be realized.

Further, in the process of manufacturing the solid-state image sensor, the height H1 of the gate electrode 56 on the photodiode formation region 59 side is determined depending on the amount of etching at the time when the gate electrode 56 is selectively etched. In addition, the length L1 of the first spacer 57 depends on the height H1 of the gate electrode 56 on the photodiode formation region 59 side. Therefore, the length L1 of the first spacer 57 can be controlled with the amount of etching at the time when the gate electrode 56 is selectively etched being set as a process parameter. Further, in the process of manufacturing the solid-state image sensor, the height H2 of the gate electrode on the floating diffusion formation region 60 side is determined depending on the deposition thickness by which the second insulating film 62 is deposited. Further, the length L2 of the second spacer 58 depends on the height H2 of the gate electrode 56 on the floating diffusion formation region 60 side. Therefore, the length L2 of the second spacer 58 can be controlled with the deposition thickness of the second insulating film 62 being set as a process parameter. As a result, the length L1 of the first spacer 57 and the length L2 of the second spacer 58 can be controlled independently of each other. Thus, the suppression of the dark current on the floating diffusion FD side and the striking of the balance between the characteristics of the dark current and the afterimage on the photodiode PD side can be realized at the same time.

<4. Structure of Solid-State Image Sensor According to Second Embodiment>

Figure 5:
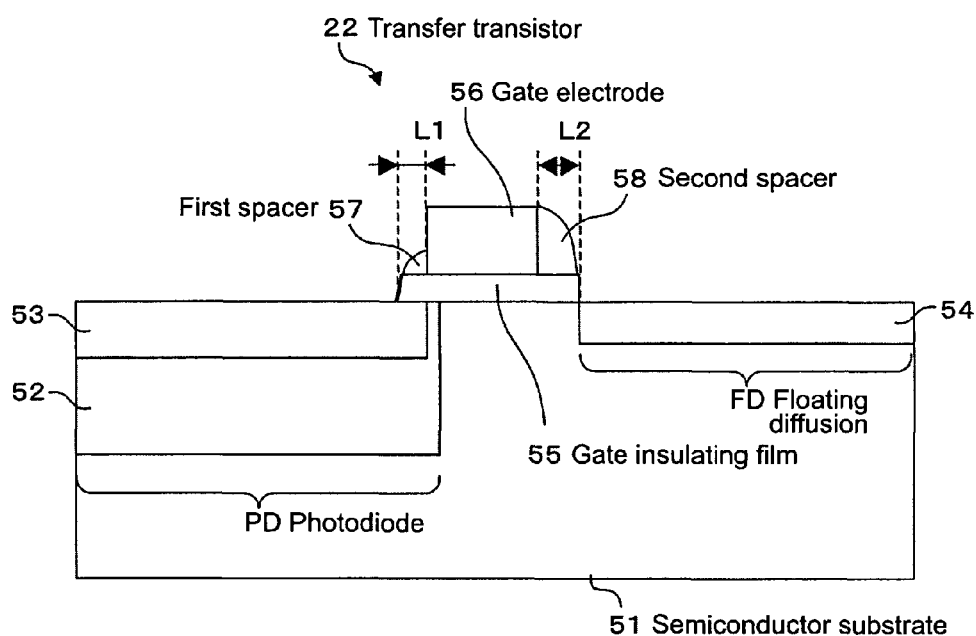
FIG. 5 is an enlarged cross-sectional view showing a part of a solid-state image sensor according to a second embodiment of the present invention.

FIG. 5 is an enlarged cross-sectional view showing a part of a solid-state image sensor according to a second embodiment of the present invention. It should be noted that in the second embodiment of the present invention, the same components as those of the first embodiment are denoted by the same reference numerals or symbols. In FIG. 5, the semiconductor substrate 51 is provided with the photodiode PD serving as the photoelectric converter and the floating diffusion FD serving as the charge detector. The photodiode PD has a P-N junction structure including the N-type impurity region 52 and the P-type impurity region 53. The floating diffusion FD is formed of the N-type impurity region 54. The transfer transistor 22 includes the gate insulating film 55, the gate electrode 56, the first spacer 57, and the second spacer 58. Further, on the semiconductor substrate 51, the first spacer 57 and the second spacer 58 are asymmetrically formed. That is, when the length L1 of the first spacer 57 and the length L2 of the second spacer 58 are compared, the length L1 of the first spacer 57 is set to be shorter than the length L2 of the second spacer 58. The structure mentioned above is the same as that of the first embodiment.

Here, in the first embodiment, by providing the step to the gate electrode 56, the height of the gate electrode 56 on the photodiode PD side and that on the floating diffusion FD side are set to be different. In contrast, in this embodiment, a step is not formed on the gate electrode 56, and the gate electrode 56 on the photodiode PD side and that on the floating diffusion FD side are the same.

<5. Method of Manufacturing Solid-State Image Sensor According to Second Embodiment>

Figure 6A:
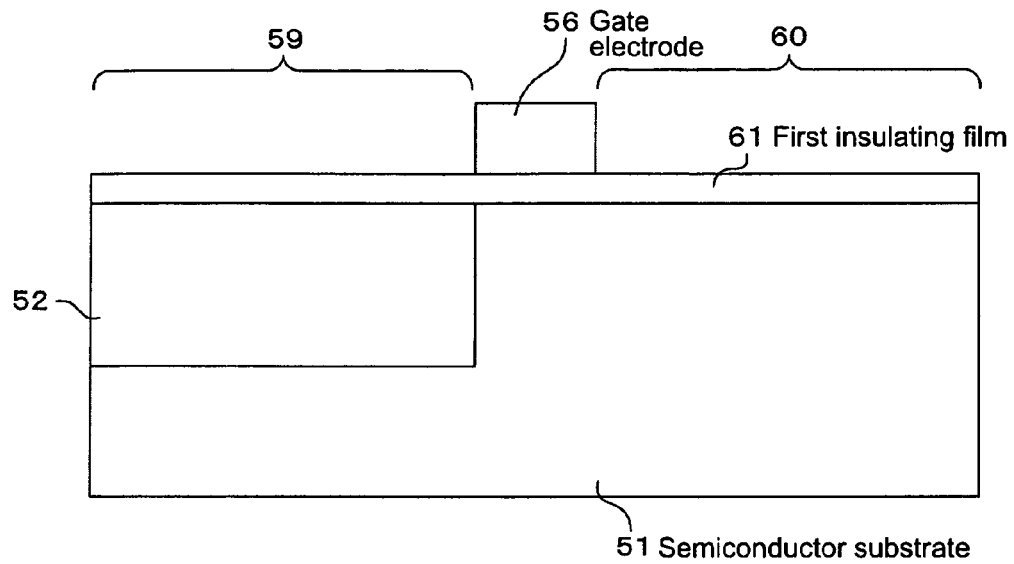
FIG. 6 is a diagram (part 1) for explaining a method of manufacturing the solid-state image sensor according to the second embodiment of the present invention.

FIGS. 6A, 6B, 7A, and 7B are diagrams for explaining a method of manufacturing the solid-state image sensor according to the second embodiment of the present invention. First, as shown in FIG. 6A, on the semiconductor substrate 51, the first insulating film 61 and the gate electrode 56 are formed in addition to an element isolation region (not shown). The first insulating film 61 corresponds to the gate insulating film 55 and is formed so as to broadly cover the upper surface of the semiconductor substrate 51 in this stage. The gate electrode 56 is formed into a predetermined shape by a patterning process. Subsequently, an ion implantation of N-type impurities is performed to the semiconductor substrate 51, thereby forming the N-type impurity region 52. As in the case of the first embodiment, to the semiconductor substrate 51, the photodiode formation region 59 and the floating diffusion formation region 60 are provided. The N-type impurity region 52 is formed by performing the ion implantation of the N-type impurities to the photodiode formation region 59.

Figure 6B:
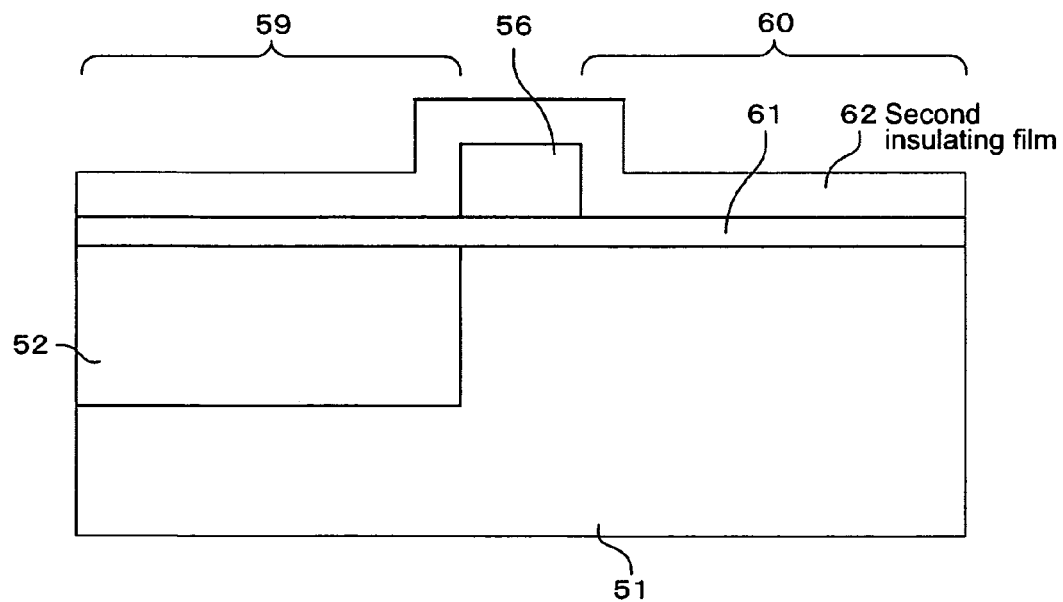

Next, as shown in FIG. 6B, on the semiconductor substrate 51, the second insulating film 62 is formed in a state of covering the gate insulating film 55 and the gate electrode 56. In this case, the second insulating film 62 is deposited so as to cover the entire surface of the semiconductor substrate 51. At this time, the thickness of the second insulating film 62 is determined in consideration of the length L2 (see, FIG. 2) of the second spacer 58 formed in the following process.

Figure 7A:
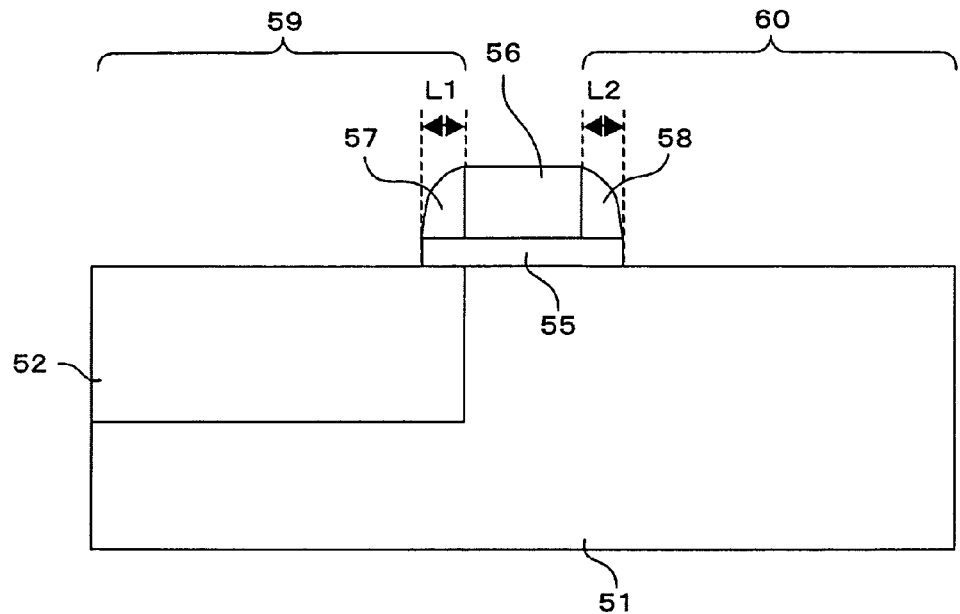
FIG. 7 is a diagram (part 2) for explaining the method of manufacturing the solid-state image sensor according to the second embodiment of the present invention.

Next, as shown in FIG. 7A, the first insulating film 61 and the second insulating film 62 are etched (etching back process), thereby exposing the surface (upper surface) of the semiconductor substrate 51. As a result, the first spacer 57 is formed on a sidewall of the gate electrode 56 on the photodiode formation region 59 side, and the second spacer 58 is formed on the other sidewall of the gate electrode 56 on the floating diffusion formation region 60 side. In this case, the first spacer 57 is formed of an insulating material protruded from the sidewall of the gate electrode 56 toward the photodiode formation region 59 side. The second spacer 58 is formed of an insulating material protruded from the other sidewall of the gate electrode 56 toward the floating diffusion formation region 60 side. In addition, in the etching process of the first insulating film 61 and the second insulating film 62, the first and second insulating films 61 and 62 are etched at the same time other than the part lower than the gate electrode 56. In this way, on the lower side of the gate electrode 56, the gate insulating film 55 is formed of the insulating material of the first insulating film 61. In addition, on the sidewall of the gate electrode 56, the first spacer 57 is formed of the insulating material of the first insulating film 61 and the second insulating film 62, and on the other sidewall of the gate electrode 56, the second spacer 58 is formed of the insulating material of the first insulating film 61 and the second insulating film 62. In this stage, the first spacer 57 and the second spacer 58 are symmetrically formed. Therefore, the length L1 of the first spacer 57 and the length L2 of the second spacer 58 are the same.

Figure 7B:
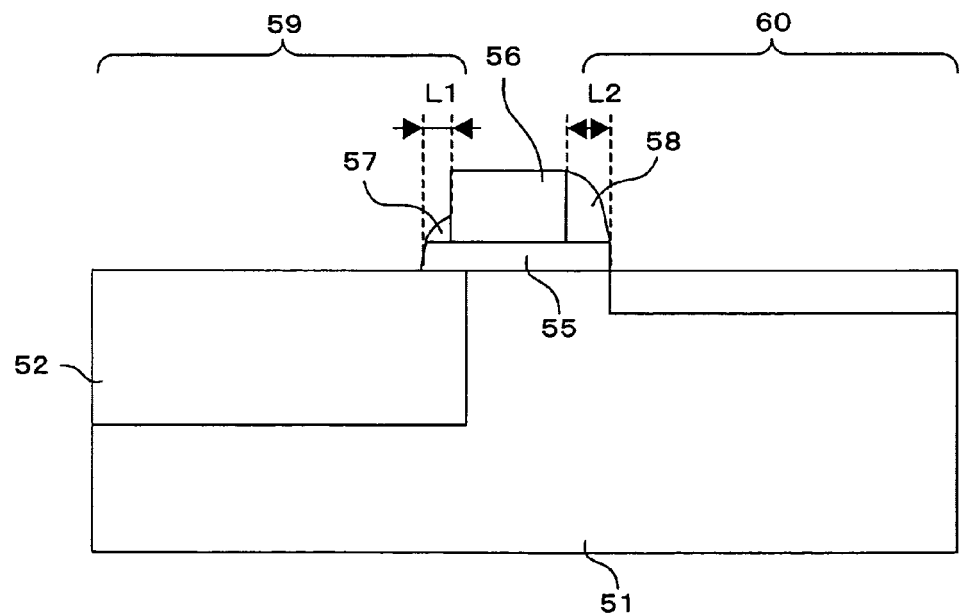

Next, as shown in FIG. 7B, the first spacer 57 on the photodiode formation region 59 side is selectively etched, thereby reducing the length L1 of the first spacer 57. In this stage, the first spacer 57 and the second spacer 58 are asymmetrically formed, and the length L1 of the first spacer is set to be shorter than the length L2 of the second spacer 58.

Next, by performing the ion implantation of the P-type impurities to the semiconductor substrate 51 with the photodiode formation region 59 being a target, the P-type impurity region 53 is formed. Further, by performing the ion implantation of the N-type impurities to the semiconductor substrate 51 with the floating diffusion formation region 60 being a target, the N-type impurity region 54 is formed. The P-type impurity region 53 is formed by performing the ion implantation of the P-type impurities to the semiconductor substrate 51 with the first spacer 57 being a mask. Therefore, the P-type impurity region 53 is formed in the self-aligned manner with respect to the first spacer 57. The N-type impurity region 54 is formed by performing the ion implantation of the N-type impurities to the semiconductor substrate 51 with the second spacer 58 being a mask. Therefore, the N-type impurity region 54 is formed in the self-aligned manner with respect to the second spacer 58. In this stage, the photodiode PD constituted of the N-type impurity region 52 and the P-type impurity region 53 and the floating diffusion FD formed of the N-type impurity region 54 are formed. As a result, the solid-state image sensor having the structure shown in FIG. 5 can be obtained.

In the second embodiment of the present invention, in the structure of the solid-state image sensor, the length L1 of the first spacer 57 is set to be shorter than the length L2 of the second spacer 58. Therefore, on the photodiode PD side, regardless of the length L2 of the second spacer 58, the length L1 of the first spacer 57 can be set in accordance with the optimal value for striking the balance between the characteristics of the dark current and the afterimage. In addition, on the floating diffusion FD side, regardless of the length L1 of the first spacer 57, the length L2 of the second spacer 58 can be set in accordance with the size suitable for suppressing the dark current. As a result, the suppression of the dark current on the floating diffusion FD side and the striking of the balance between the characteristics of the dark current and the afterimage on the photodiode PD side can be realized at the same time.

Further, in the process of manufacturing the solid-state image sensor, the length L1 of the first spacer 57 is determined depending on the amount of etching at the time when the first spacer 57 is selectively etched. Therefore, the length L1 of the first spacer 57 can be controlled with the amount of etching at the time when the first spacer 57 is selectively etched being set as a process parameter. Further, in the process of manufacturing the solid-state image sensor, the height of the gate electrode 56 is determined depending on the deposition thickness by which the second insulating film 62 is deposited. Further, the length L2 of the second spacer 58 depends on the height of the gate electrode 56. Therefore, the length L2 of the second spacer 58 can be controlled with the deposition thickness of the second insulating film 62 being set as a process parameter. As a result, the length L1 of the first spacer 57 and the length L2 of the second spacer 58 can be controlled independently of each other. Thus, the suppression of the dark current on the floating diffusion FD side and the striking of the balance between the characteristics of the dark current and the afterimage on the photodiode PD side can be realized at the same time.

It should be noted that in the second embodiment, the first spacer 57 and the second spacer 58 are symmetrically formed by etching the insulating films 61 and 62, and then the first spacer 57 is selectively etched to shorten the length L1 thereof, but the present invention is not limited to this. For example, after the first spacer 57 and the second spacer 58 are symmetrically formed by etching the insulating films 61 and 62, a third spacer (not shown) may be formed so as to cover the sidewall of the second spacer 58, thereby increasing the length of the spacer on the floating diffusion FD side.

<6. Application Example>

Figure 8:
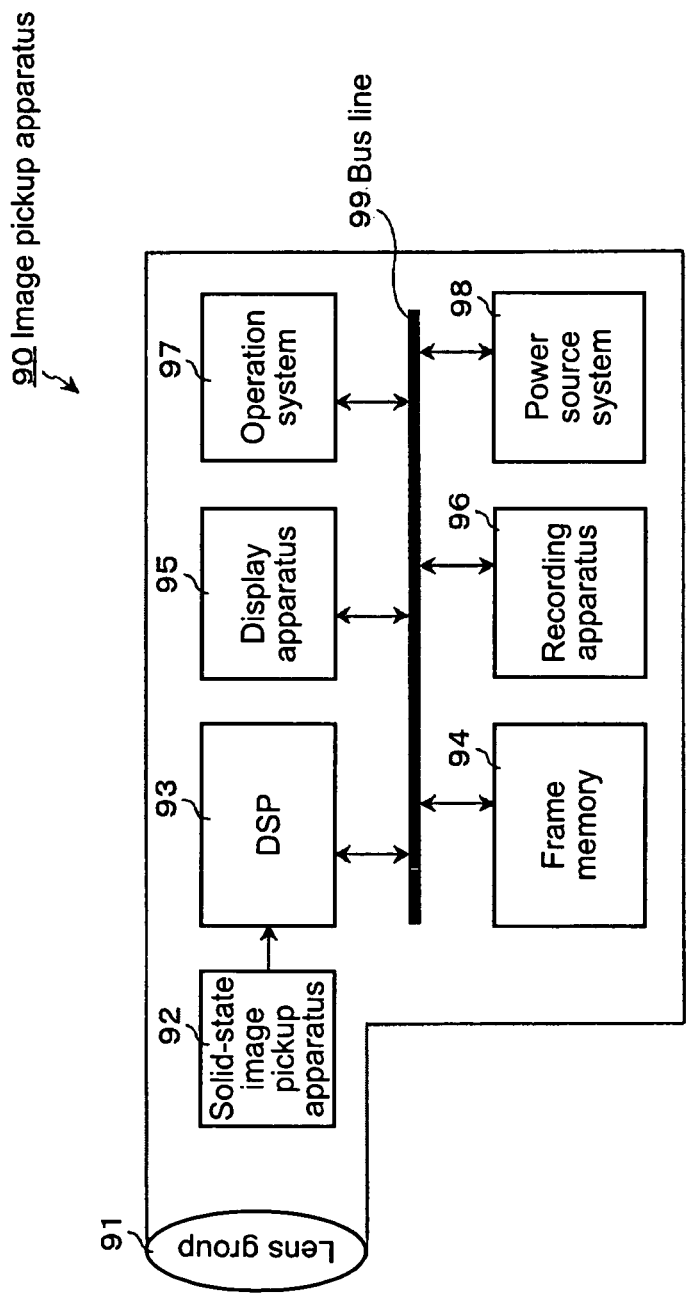
FIG. 8 is a block diagram showing a structural example of an image pickup apparatus to which the present invention is applied.
Figure 9:
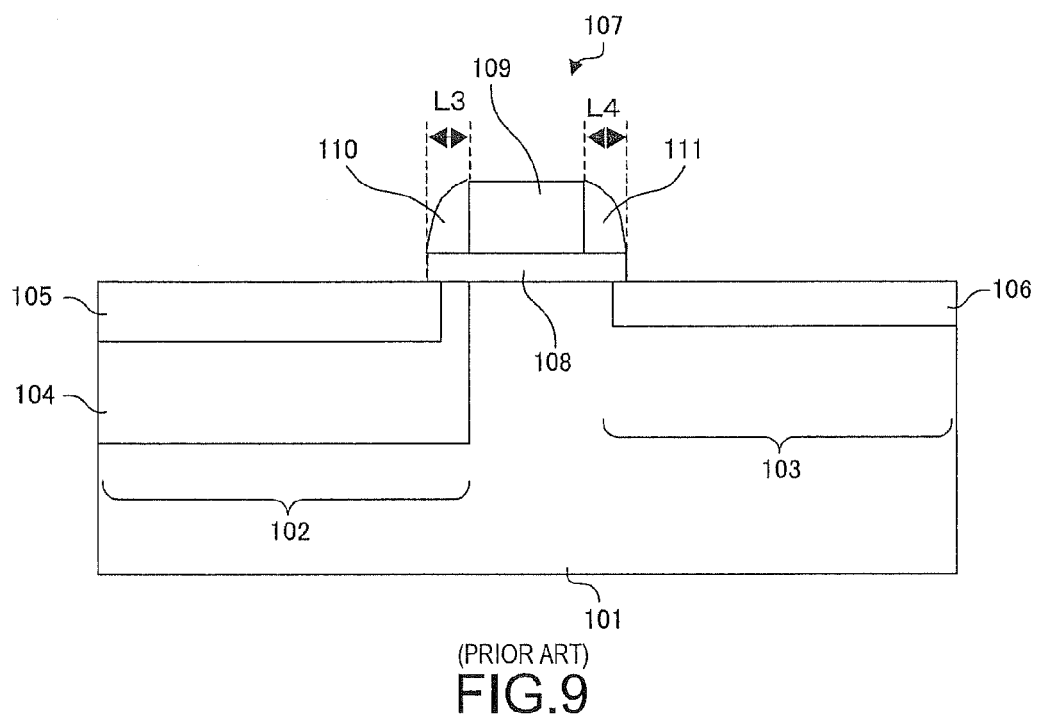
FIG. 9 is a cross-sectional view showing an example of a solid-state image sensor in related art.

FIG. 8 is a block diagram showing a structural example of an image pickup apparatus to which the present invention is applied. An image pickup apparatus 90 shown in FIG. 8 includes an optical system having a lens group 91, a solid-state image pickup apparatus 92, a DSP circuit 93, a frame memory 94, a display apparatus 95, a recording apparatus 96, an operation system 97, and a power source system 98. Among those components, the DSP circuit 93, the frame memory 94, the display apparatus 95, the recording apparatus 96, the operation system 97, and the power source system 98 are mutually connected through a bus line 99.

The lens group 91 collects incident light (image light) from a subject and forms an image on an imaging surface of the solid-state image pickup apparatus 92. The solid-state image pickup apparatus 92 converts a light amount of the incident light that is imaged on the imaging surface by the lens group 91 into an electrical signal for each pixel, and outputs it as a pixel signal. As an element structure of the solid-state image pickup apparatus 92, the structure of the solid-state image sensor described above is applied.

The display apparatus 95 is formed of a panel-type display apparatus such as a liquid crystal display apparatus and an organic EL (electro-luminescence) display apparatus, and displays a moving image or a still image taken by the solid-state image pickup apparatus 92. The recording apparatus 96 records the moving image or the still image taken by the solid-state image pickup apparatus 92 on a recording medium such as a non-volatile memory, a videotape, and a DVD (digital versatile disk).

The operation system 97 gives operation commands for various functions of the image pickup apparatus 90 under the control of a user who uses the image pickup apparatus 90. The power source system 98 appropriately supplies various power sources as operation sources to the DSP circuit 93, the frame memory 94, the display apparatus 95, the recording apparatus 96, and the operation system 97.

The image pickup apparatus 90 as described above is applied to a camera module for a mobile apparatus, such as a video camera, a digital still camera, and a camera cellular phone. But, in addition to those modules, the present invention can also be applied to, for example, vehicles such as an automobile and an airplane in which a camera equipped with the solid-state image sensor is incorporated. In this case, in an example of an automobile, in a system that displays, on an in-car display apparatus, a blind spot for a driver by taking an image thereof, the element structure according to the above embodiments can be employed as the solid-state image sensor for cameras incorporated in the front, the back, the sides of the automobile. In addition, vehicles such as an automobile and an airplane equipped with the solid-state image sensor that uses the element structure of the above embodiments can be a form of the image pickup apparatus according to the present invention, in addition to the camera module for the mobile apparatus described above.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state image sensor, comprising
a photoelectric converter to store a signal charge that is subjected to photoelectric conversion;
a charge detector to detect the signal charge; and
a transfer transistor to transfer the signal charge from the photoelectric converter to the charge detector,
wherein the transfer transistor includes
a gate insulating film,
a gate electrode formed on the gate insulating film,
a first spacer formed of a first portion of another insulating film, the first portion of the another insulating film formed on a first surface portion of the gate insulating film extending in a length direction, having a first height on a sidewall of the gate electrode on a side of the photoelectric converter, and
a second spacer formed of a second portion of the another insulating film, the second portion of the another insulating film formed on a second surface portion of the gate insulating film extending in the length direction, having a second height greater than the first height on another sidewall of the gate electrode on a side of the charge detector, and
wherein the first spacer is shorter in the length direction than the second spacer.

2. The solid-state image sensor according to claim 1, wherein the gate electrode includes a part on the side of the photoelectric converter and a part on the side of the charge detector, the part on the side of the photoelectric converter is lower than the part on the side of the charge detector.

3. An image pickup apparatus, comprising:
a solid-state image sensor including a photoelectric converter to store a signal charge that is subjected to photoelectric conversion, a charge detector to detect the signal charge, and a transfer transistor to transfer the signal charge from the photoelectric converter to the charge detector,
wherein the transfer transistor of the solid-state image sensor includes
a gate insulating film,
a gate electrode formed on the gate insulating film,
a first spacer formed of a first portion of another insulating film, the first portion of the another insulating film formed on a first surface portion of the gate insulating film extending in a length direction, having a first height on a sidewall of the gate electrode on a side of the photoelectric converter, and a second spacer formed of a second portion of the another insulating film, the second portion of the another insulating film formed on a second surface portion of the gate insulating film extending in the length direction, having a second height greater than the first height on another sidewall of the gate electrode on a side of the charge detector, and wherein the first spacer is shorter in the length direction than the second spacer.

* * * * *